United States Patent
Meiler et al.

(10) Patent No.: US 11,923,785 B2
(45) Date of Patent: Mar. 5, 2024

(54) POWER MODULE FOR THE OPERATION OF AN ELECTRIC VEHICLE DRIVE WITH IMPROVED TEMPERATURE DETERMINATION OF THE POWER SEMICONDUCTOR

(71) Applicant: ZF Friedrichshafen AG, Friedrichshafen (DE)

(72) Inventors: Michael Meiler, Bayreuth (DE); Johannes Hager, Marktleugast (DE); Stefan Hain, Speichersdorf (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 0 days.

(21) Appl. No.: 17/670,000

(22) Filed: Feb. 11, 2022

(65) Prior Publication Data
US 2022/0263429 A1    Aug. 18, 2022

(30) Foreign Application Priority Data
Feb. 12, 2021   (DE) .......................... 102021201363.5

(51) Int. Cl.
*H02M 7/537*    (2006.01)
*B60L 50/51*    (2019.01)
(Continued)

(52) U.S. Cl.
CPC .............. *H02M 7/537* (2013.01); *B60L 50/51* (2019.02); *G01K 13/00* (2013.01);
(Continued)

(58) Field of Classification Search
CPC .............. B60L 2210/00; B60L 2210/44; B60L 2240/00; B60L 2240/545; B60L 50/00;
(Continued)

(56) References Cited

U.S. PATENT DOCUMENTS

| 2014/0233278 | A1* | 8/2014 | Li ...................... H02M 7/53873 |
| | | | 363/37 |
| 2019/0250046 | A1* | 8/2019 | Sun ..................... G01R 31/2619 |
| 2021/0408939 | A1* | 12/2021 | Hain ....................... B60L 50/51 |

FOREIGN PATENT DOCUMENTS

| DE | 10 2013 219 373 A1 | 3/2015 |
| DE | 10 2020 208 167 A1 | 12/2021 |

OTHER PUBLICATIONS

Office Action dated Aug. 31, 2021 for German Patent Application No. 10 2021 201 363.5 (14 pp.), note: pp. 1 and 2 are English language Explanations to Section C. Result of Determination Document.

* cited by examiner

*Primary Examiner* — Ryan Johnson
(74) *Attorney, Agent, or Firm* — Crowell & Moring LLP

(57) ABSTRACT

Method for measuring an operating temperature of a power module (10) that is used for operating an electric vehicle drive, the power module (10) comprising a plurality of semiconductor switching elements (14) and drive electronics (16), wherein the semiconductor switching elements (14) can be switched by the drive electronics (16) in such a way that the semiconductor switching elements (14) allow or interrupt a drain-source current in order to convert the direct current fed into the power module (10) at the input side into an output-side alternating current, wherein the method comprises measurement of a voltage present at a point located on a side of a diode (22) that is connected in series with the semiconductor switching element (14) and that faces away from the semiconductor switching element (14), wherein the method comprises measurement of a drain-source current of the semiconductor switching element (14) that is generated by a current source (18), wherein the method comprises
(Continued)

determination of a mathematical dependency between the measured voltage and the measured current.

19 Claims, 1 Drawing Sheet

(51) Int. Cl.
*G01K 13/00* (2021.01)
*G01R 19/00* (2006.01)
*H02M 1/08* (2006.01)
*H02M 1/32* (2007.01)

(52) U.S. Cl.
CPC .......... *G01R 19/0038* (2013.01); *H02M 1/08* (2013.01); *H02M 1/327* (2021.05); *B60L 2210/44* (2013.01); *B60L 2240/525* (2013.01); *B60L 2240/545* (2013.01); *G01K 2217/00* (2013.01)

(58) Field of Classification Search
CPC .... B60L 50/51; G01K 13/00; G01K 2217/00; G01K 7/00; G01K 7/16; G01K 7/42; G01R 19/00; G01R 19/0038; H02M 1/00; H02M 1/08; H02M 1/327; H02M 7/537; Y02T 10/00; Y02T 10/64; Y02T 10/70; Y02T 10/72
USPC ........................................................ 307/10.1
See application file for complete search history.

POWER MODULE FOR THE OPERATION OF AN ELECTRIC VEHICLE DRIVE WITH IMPROVED TEMPERATURE DETERMINATION OF THE POWER SEMICONDUCTOR

CROSS-REFERENCE TO RELATED APPLICATIONS

This application claims priority from German Application No. DE102021201363.5, filed on Feb. 12, 2021, the entirety of which is hereby fully incorporated by reference herein.

TECHNICAL FIELD

The present invention relates to the field of electric mobility, in particular of power modules for the operation of an electric drive for a vehicle.

TECHNICAL BACKGROUND

Power modules, in particular integrated power modules, are being increasingly applied in motor vehicles. Power modules of this sort are, for example, employed in DC/AC inverters whose purpose is to supply multiphase alternating currents to electric machines such as electric motors. Direct current generated by means of a DC energy source, such as a battery, is converted here into a multiphase alternating current. The power modules are based on power semiconductors, in particular transistors such as IGBTs, MOSFETs and HEMTs. Further fields of application include DC/DC converters and AC/DC rectifiers, and transformers.

Power switches which are used in a bridge circuit are usually constructed from the power semiconductors. A frequent example is provided by what are known as half-bridges, which comprise a high-side component and a low-side component. The high-side and low-side components each comprise one or a plurality of power switches, namely high-side power switches and low-side power switches. Through the controlled switching of the high-side and low-side power switches, the direction of the current generated at the output of the power module (output current) can be changed, within a very short cycle time, between a positive current direction and a negative current direction. This enables what is known as pulse-width modulation in order, in the case of a DC/AC inverter, that an alternating current is generated on the basis of a direct current fed in at an input side of the power module.

It is advantageous for all these applications for the switching time of the power switches used to be sufficiently short. Thanks to the advances in the field of power semiconductors, short switching times can be realized with what are known as wide bandgap semiconductors such as SiC and GaN.

The controlled switching of the power switches is performed and implemented by drive electronics. The drive electronics usually comprise a controller component to generate a control signal on the basis of an operating state of the electric vehicle drive and/or of the power module, and a driver component in communication with the controller component for driving the power switches on the basis of the control signal.

It is important for the operation of the power modules that the power switches do not exceed the maximum permitted temperature of the semiconductor materials used. Exceeding the maximum permitted temperature leads to an impairment of the power switches and thus also of the power module.

Various concepts for determination of the temperature of the power switches are known from the prior art. Temperature sensors that have a negative temperature coefficient (NTC) or a positive temperature coefficient (PTC) are, for example, used to ascertain the temperature of the power switches. Because the temperature sensors are spatially separated and electrically isolated from the power switches concerned, the operating temperature of the power switches can only be estimated in this way. However, due to the large distance of the respective temperature sensor from the object under measurement, the accuracy of such a temperature estimate is not high enough. Due to the uncertainty of measurement that remains, the power semiconductors must be protected against overheating, which causes additional costs.

SUMMARY

The invention is therefore based on the object of enabling a power module in which the determination of the operating temperature of the power switches can be performed with greater accuracy.

This object is achieved by a power module and a method according to the independent claims.

In the context of this invention, the power module serves for the operation of an electric drive of a vehicle, in particular of an electric vehicle and/or of a hybrid vehicle. The power module is preferably employed in a DC/AC inverter. The power module serves in particular to supply current to an electric machine, for example an electric motor and/or a generator. A DC/AC inverter is used to generate a multiphase alternating current from a direct current generated by means of a DC voltage of an energy source such as a battery.

The power module comprises a plurality of semiconductor switching elements (or power switches). These semiconductor-based power switches are used to generate an alternating current at the output side by driving the individual semiconductor switching elements on the basis of the direct current fed in at the input side. The drive of the semiconductor switching elements is made by means of the drive electronics that comprise one or a plurality of circuit boards to which a large number of electronic components are attached. The drive electronics preferably comprise a controller component to generate a control signal on the basis of an operating state of the power module, and a driver component for driving the semiconductor switching elements on the basis of the control signal. The drive is preferably based on what is known as pulse-width modulation, by means of which a sinusoidal profile is provided for the respective phase current of the output side alternating current.

The multiple semiconductor switching elements preferably form a bridge circuit arrangement that can comprise one or a plurality of bridge circuits (such as half-bridges). Each bridge circuit, or half-bridge, comprises one or a plurality of high-side semiconductor switching elements (HS switches) connected in parallel, and one or a plurality of low-side semiconductor switching elements (LS switches) connected in parallel. The HS switch or switches is/are connected in series with the LS switch or switches. Each half-bridge is assigned in the inverter to one current phase of the multiphase alternating current (output current). The individual semiconductor switching elements can be designed as IGBTs, MOSFETs, or HEMTs. The semiconductor material on which the respective semiconductor element is based preferably comprises what is known as a wide bandgap semiconductor such as silicon carbide (SiC) or gallium nitride (GaN), but can alternatively or in addition comprise silicon.

It is possible, for the purpose of cooling the power switches and other electronic components in the power module, to provide a heatsink to which the semiconductor switching elements are thermally coupled.

The power module further comprises a temperature measurement device that is designed to carry out a method for measuring an operating temperature of the power module. The method comprises measurement of a voltage present at a point located on a side of a diode that is connected in series with the semiconductor switching element and that faces away from the semiconductor switching element. The diode is preferably a decoupling diode. The semiconductor switching element and the diode, together with the measuring point, preferably with reference to the source or emitter potential, form a closed mesh. The measuring point, further preferably, acquires a series voltage from the decoupling diode and the semiconductor switching element.

The method moreover comprises measurement of a load current (e.g. a drain-source current) of the semiconductor switching element that is generated by a current source. In addition, the method comprises determination of a mathematical dependency between the measured voltage and the measured current.

The operating temperature of the semiconductor switching element concerned can be obtained from the mathematical dependency. The mathematical dependency describes, for example, the measured voltage as a function of the measured current, wherein the method further comprises determination of a derivative of the function with respect to the measured current. Preferably, an operating temperature of the semiconductor switching element belonging to the value of the derivative can be ascertained on the basis of a predetermined correlation between a resistance of the semiconductor switching element and its operating temperature.

The operating temperature of the semiconductor switching element can be determined in this way with particularly simple circuitry. In comparison with the temperature measuring methods known from the prior art, the method according to the invention is particularly accurate, since temperature sensors that only (indirectly) measure the temperature prevailing in the vicinity of the respective semiconductor switching elements are omitted. The temperature is instead ascertained directly from measurement data relating to the current and voltage present at the respective semiconductor switching element. The method according to the invention is therefore a direct temperature measurement.

Advantageous embodiments and developments are disclosed in the dependent claims.

BRIEF DESCRIPTION OF THE DRAWINGS

Embodiments are now described by way of example, and with reference to the appended drawings, in which.

Identical reference signs in the figures indicate referenced components that are identical or functionally similar.

DETAILED DESCRIPTION

Figure 1:
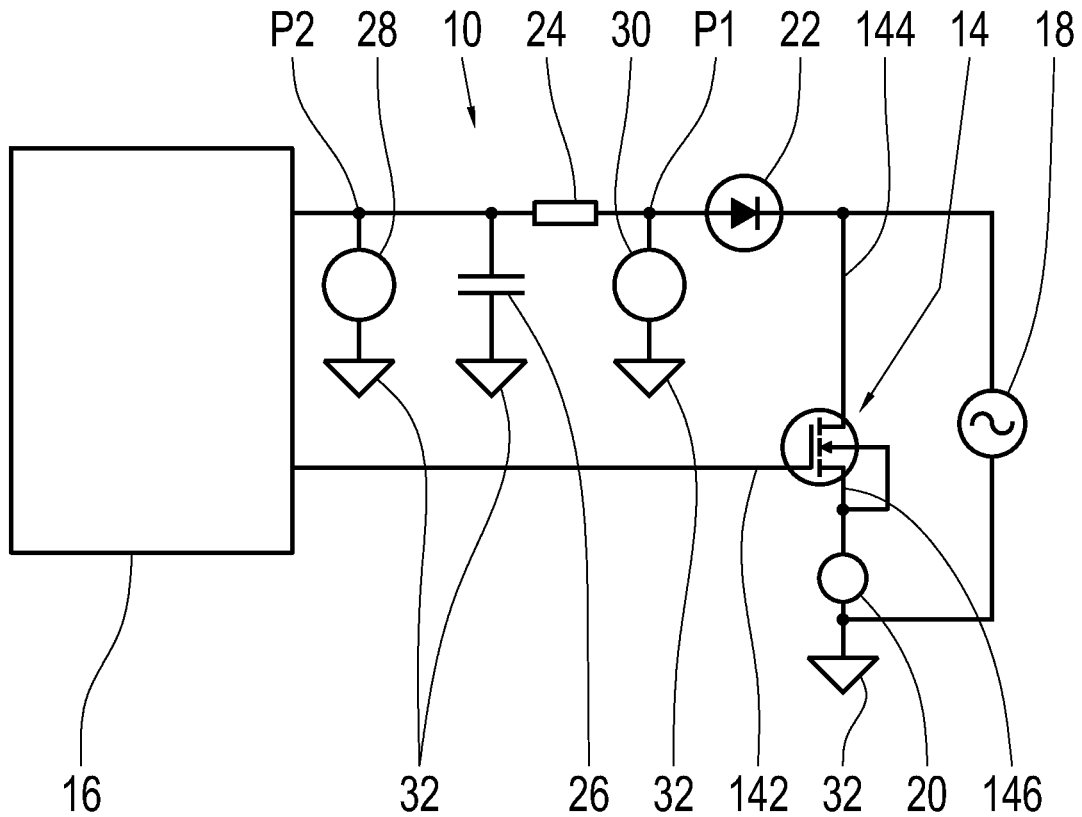
FIG. 1 shows a schematic illustration of a power module according to one embodiment.

FIG. 1 shows a schematic illustration of a power module according to the invention 10. The power module 10 comprises a plurality of semiconductor switching elements 14 (wherein, for reasons of clarity, only a single semiconductor switching element 14 is shown in FIG. 1) and drive electronics 16. The semiconductor switching elements 14 can be switched by means of the drive electronics 16 in such a way that the semiconductor switching elements 14 allow or interrupt a drain-source current in order to convert an input-side direct current fed to the power module 10 into an output-side alternating current. The semiconductor switching elements 14 form one or a plurality of half-bridges, each of which comprises a high side and a low side. The high side and the low side each comprise one or a plurality of semiconductor switching elements that are connected in parallel. Through controlled drive of the semiconductor switching elements 14, three phase currents, differing from one another in phase, can be generated on the basis of the input-side direct current.

Figure 2:
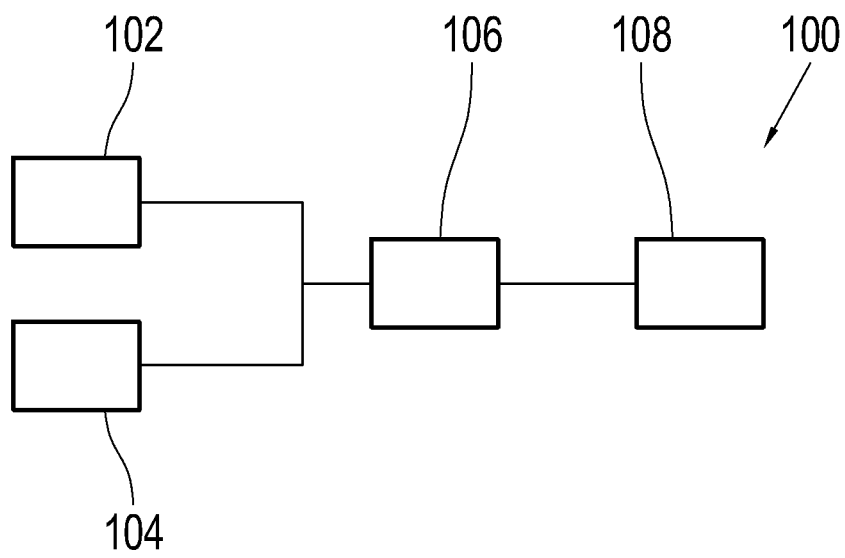
FIG. 2 shows a schematic illustration of a method for measuring the operating temperature of the power module.

In order to determine the temperature of one of the semiconductor switching elements 14, in a step 102 (see the schematic illustration of the measuring method in FIG. 2) according to the invention, a voltage is measured that is present at a point P1, P2 that is located on a side of a diode 22 that faces away from the semiconductor switching element 14 concerned and is connected in series with the semiconductor switching element 14. As shown in FIG. 1, a first point P1 and a second point P2 can be used for this. A first voltage V1 is measured at the first point P1 by means of a first voltage measuring device 30. A second voltage V2 is measured at the second point by means of a second voltage measuring device 28. A filter circuit comprising a series resistor 24 and a capacitor 26 is arranged between the first point P1 and the second point P2. On the semiconductor switching element side, the diode 22 is connected to a drain contact 144 of the semiconductor switching element 14, and is located next to the series resistor 24 in series with the semiconductor switching element 14. The series resistor 24 is connected downstream to the drive electronics 16, to which a gate electrode 142 of the semiconductor switching element 14 is also connected.

Either the first voltage V1, the second voltage V2, or a third voltage derived computationally from the first voltage V1 and the second voltage V2, can be used as the measured voltage. In a further step 104, a drain-source current of the semiconductor switching element 1, generated by a current source 18 and flowing from the drain contact 144 to a source contact 146 of the semiconductor switching element 14, is additionally measured.

In a further step 106, a mathematical dependency between the measured voltage and the measured current is ascertained. The measured voltage can, for example, be plotted against the measured current graphically, in order to obtain a characteristic current-voltage curve. The mathematical dependency to be ascertained is preferably a function that describes the measured voltage depending on the measured current. The measurement method can further comprise a step 108 in which the first derivative of the function with respect to the current is calculated. This first derivative corresponds to the gradient of the characteristic current-voltage curve, and has the dimension of an ohmic resistance. Due to the topography of the circuitry, the resistance determined in this way is equal to the internal resistance of the semiconductor switching element 14. With the aid of a previously-stored correlation between the internal resistance of the semiconductor switching element 14 under consideration and its operating temperature, the current operating temperature of the semiconductor switching element 14 can be deduced on the basis of the first derivative or the gradient.

The diode 22 can be a decoupling diode, for example a Schottky diode, by means of which the applied high voltage is decoupled from the semiconductor switching element 14.

According to a further embodiment, the measured voltage can be corrected by an offset. The offset corresponds to the voltage value at the intersection between the characteristic current-voltage curve and the voltage axis. The voltage, corrected by this offset, corresponds to the drain-source voltage actually present at the semiconductor switching element 14. The offset is found from the characteristic curve of the diode through which a defined measurement current flows. The offset voltage, which corresponds to the forward voltage of the diode 22, is obtained in this way. The mathematical method can ascertain this offset voltage, and calculate it out.

REFERENCE DESIGNATIONS

10 Power module
14 Semiconductor switching element
16 Drive electronics
18 Current source
20 Current measuring instrument
22 Diode
24 Series resistor
26 Capacitor
30 First voltage measuring device
28 Second voltage measuring device
32 Ground
102-108 Method steps
P1 First point
P2 Second point

What is claimed is:

1. A method for measuring an operating temperature of a power module that is used for operating an electric vehicle drive, the power module comprising at least one semiconductor switching element and drive electronics, wherein the at least one semiconductor switching element is configured to be switched by the drive electronics in such a way that the at least one semiconductor switching element allows or interrupts a load current in order to convert direct current fed into the power module at an input side into an output-side alternating current,
wherein the method comprises:
measuring a value of a voltage present at a point located on an upstream side of a diode that is connected in series with the at least one semiconductor switching element;
measuring a drain-source current of the at least one semiconductor switching element that is generated by a current source, and
determining a mathematical dependency between the measured value of the voltage and the measured current.

2. The method according to claim 1, wherein the mathematical dependency describes the measured value of the voltage as a function of the measured current.

3. The method according to claim 2, wherein the method further comprises determining a derivative of the function with respect to the measured current.

4. The method according to claim 3, wherein the method further comprises ascertaining an operating temperature of the at least one semiconductor switching element belonging to a value of the derivative on the basis of a predetermined correlation between a resistance of the at least one semiconductor switching element and its operating temperature.

5. The method according to claim 1, comprising:
measuring the drain-source current using a current measuring device; and
measuring a phase current of the alternating current using the current measuring device.

6. The method according to claim 1, comprising:
determining a voltage offset of the measured value of the voltage for the case in which the measured current is equal to zero; and
determining the mathematical dependency between the measured value of the voltage corrected by the voltage offset and the measured current.

7. The method according to claim 1, wherein the measuring the value of the voltage present at the point further comprises:
measuring at least one of a first voltage or a second voltage, wherein the first voltage is present at a first point that is located on the upstream side of the diode, wherein the second voltage is present at a second point that is also located on the upstream side of the diode, wherein the second point is located on an upstream side of the first point.

8. The method according to claim 7, wherein a filter circuit is arranged between the first point and the second point.

9. The method according to claim 7, wherein determining the mathematical dependency further comprises:
determining the mathematical dependency between the measured current and at least one of the first voltage, the second voltage, or a third voltage resulting computationally from the first voltage and the second voltage.

10. A power module for operating an electric vehicle drive, comprising:
at least one semiconductor switching element and drive electronics, wherein the drive electronics is configured to switch the at least one semiconductor switching element in such a way that the at least one semiconductor switching element allows or interrupts a load current, in order to convert an input-side direct current fed to the power module into an output-side alternating current;
a diode that is connected in series with the at least one semiconductor switching element;
a controller configured to:
measure a value of a voltage present at a point located on an upstream side of the diode that is connected in series with the at least one semiconductor switching element;
measure a drain-source current of the at least one semiconductor switching element that is generated by a current source; and
determine a mathematical dependency between the measured value of the voltage and the measured current.

11. An inverter comprising the power module according to claim 10.

12. The power module according to claim 10, wherein the mathematical dependency describes the measured value of the voltage as a function of the measured current.

13. The power module according to claim 12, wherein the controller is further configured to determine a derivative of the function with respect to the measured current.

14. The power module according to claim 13, wherein the controller is further configured to ascertain an operating temperature of the at least one semiconductor switching element belonging to a value of the derivative on the basis of a predetermined correlation between a resistance of the at least one semiconductor switching element and its operating temperature.

15. The power module according to claim 10, further comprising:
   a current measuring device configured to measure both the drain-source current and a phase current of the alternating current.

16. The power module according to claim 10, wherein the controller is further configured to:
   determine a voltage offset of the measured value of the voltage for the case in which the measured current is equal to zero; and
   determine the mathematical dependency between the measured value of the voltage corrected by the voltage offset and the measured current.

17. The power module according to claim 10, wherein the controller is further configured to measure the value of the voltage present at the point by:
   measuring at least one of a first voltage or a second voltage, wherein the first voltage is present at a first point that is located on the upstream side of the diode, wherein the second voltage is present at a second point that is also located on the upstream side of the diode, wherein the second point is located on an upstream side of the first point.

18. The power module according to claim 17, further comprising:
   a filter circuit arranged between the first point and the second point.

19. The power module according to claim 17, wherein the controller is further configured to determine the mathematical dependency by:
   determining the mathematical dependency between the measured current and at least one of the first voltage, the second voltage, or a third voltage resulting computationally from the first voltage and the second voltage.

* * * * *